US007069494B2

(12) United States Patent
Cargnoni et al.

(10) Patent No.: US 7,069,494 B2
(45) Date of Patent: Jun. 27, 2006

(54) APPLICATION OF SPECIAL ECC MATRIX FOR SOLVING STUCK BIT FAULTS IN AN ECC PROTECTED MECHANISM

(75) Inventors: Robert Alan Cargnoni, Austin, TX (US); Guy Lynn Guthrie, Austin, TX (US); Kirk Samuel Livingston, Austin, TX (US); William John Starke, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 467 days.

(21) Appl. No.: 10/418,549

(22) Filed: Apr. 17, 2003

(65) Prior Publication Data

US 2004/0210814 A1 Oct. 21, 2004

(51) Int. Cl.
*H03M 13/11* (2006.01)

(52) U.S. Cl. ....................... 714/763; 714/768; 714/773

(58) Field of Classification Search ................ 714/763, 714/768, 773, 753

See application file for complete search history.

(56) References Cited

U.S. PATENT DOCUMENTS 3,576,982 A * 5/1971 Duke ............................ 714/6

(Continued)

OTHER PUBLICATIONS

Kuznetsov et al., "An Error Correcting Scheme for Defective Memory", IEEE Transactions on Information Theory, vol. IT-24, No. 6, Nov. 1978, pp. 712-718.*

*Primary Examiner*—Stephen M. Baker
(74) *Attorney, Agent, or Firm*—Casimer K. Salys; Jack V. Musgrove

(57) ABSTRACT

A method of correcting an error in an ECC protected mechanism of a computer system, such as a cache or system bus, by applying data with a number of bits N to an error correction code (ECC) matrix to yield an error detection syndrome, wherein the ECC matrix has a plurality of rows and columns with a given column corresponding to a respective one of the data bits, and selected bits are set in the ECC matrix along each column and each row such that encoding for the ECC matrix allows N-bit error correction and (N−1)-bit error detection. In the illustrative embodiment, the ECC matrix has an odd number of bits set in each row thereof. In the case of an ECC protected mechanism such as a memory device, these properties facilitate the use of an inversion bit for correcting hard faults in the stored data. When an error is detected and after it is corrected, the corrected data is inverted and then rewritten to the cache array. The corresponding inversion bit for this entry is accordingly set to indicate that the data as currently stored is inverted. Thereafter, the data is re-read from the array, and if the error was due to a hard fault (stuck bit), it will appear correct (after applying the polarity indicated by the inversion bit), since the inversion will have changed the value of the defective bit to the stuck value. The inversion bit may be part of the data itself. In this case, one of the columns in the ECC matrix corresponds to the inversion bit, and each bit in that column of the matrix is set. In the case of an ECC protected mechanism such as a system bus, once a stuck bit condition is detected, the sending device can elect to send data such that the polarity of the data for that bit is always flipped to match the logic level of the stuck value on the wire. This approach allows for full single-bit correct, double-bit detect even in the presence of a stuck bit.

15 Claims, 5 Drawing Sheets

U.S. PATENT DOCUMENTS

| | | | | | |
|---|---|---|---|---|---|
| 3,582,878 | A | * | 6/1971 | Bossen et al. | 714/760 |
| 3,768,071 | A | * | 10/1973 | Knauft et al. | 714/6 |
| 3,949,208 | A | * | 4/1976 | Carter | 714/765 |
| 4,045,779 | A | * | 8/1977 | Markle | 714/824 |
| 4,175,692 | A | * | 11/1979 | Watanabe | 714/54 |
| 4,296,494 | A | * | 10/1981 | Ishikawa et al. | 714/6 |
| 4,394,763 | A | * | 7/1983 | Nagano et al. | 714/6 |
| 4,458,349 | A | * | 7/1984 | Aichelmann et al. | 714/6 |
| 4,479,214 | A | * | 10/1984 | Ryan | 714/702 |
| 4,535,455 | A | * | 8/1985 | Peterson | 714/6 |
| 4,604,751 | A | * | 8/1986 | Aichelmann et al. | 714/723 |
| 4,608,687 | A | * | 8/1986 | Dutton | 714/710 |
| 4,615,030 | A | * | 9/1986 | Kumagai | 714/824 |
| 4,661,955 | A | * | 4/1987 | Arlington et al. | 714/6 |
| 4,888,773 | A | * | 12/1989 | Arlington et al. | 714/764 |
| 5,267,242 | A | * | 11/1993 | Lavallee et al. | 714/7 |
| 5,274,646 | A | * | 12/1993 | Brey et al. | 714/758 |
| 5,384,789 | A | * | 1/1995 | Tomita | 714/755 |
| 5,533,036 | A | * | 7/1996 | Blake et al. | 714/763 |
| 5,535,226 | A | * | 7/1996 | Drake et al. | 714/773 |
| 5,632,013 | A | * | 5/1997 | Krygowski et al. | 714/7 |
| 5,644,583 | A | * | 7/1997 | Garcia et al. | 714/764 |
| 5,857,069 | A | * | 1/1999 | Kohler | 714/5 |
| 6,675,341 | B1 | * | 1/2004 | Chen et al. | 714/753 |

* cited by examiner

APPLICATION OF SPECIAL ECC MATRIX FOR SOLVING STUCK BIT FAULTS IN AN ECC PROTECTED MECHANISM

CROSS-REFERENCE TO RELATED APPLICATION

The present application is related to copending U.S. patent application Ser. No. 10/418,546 entitled "CACHE DIRECTORY ARRAY RECOVERY MECHANISM TO SUPPORT SPECIAL ECC STUCK BIT MATRIX" filed on Apr. 17, 2003.

BACKGROUND OF THE INVENTION

1. Field of the Invention

The present invention generally relates to data processing systems, and more particularly to a method and system for correcting an erroneous data bit in a computer system, such as in a cache memory, a bus or communications link, a chip interface, or other locations where error correction code (ECC) may be used.

2. Description of the Related Art

The basic structure of a conventional computer system 10 is shown in FIG. 1. Computer system 10 may have one or more processing units, two of which 12*a* and 12*b* are depicted, which are connected to various peripheral devices, including input/output (I/O) devices 14 (such as a display monitor, keyboard, and permanent storage device), memory device 16 (such as random access memory or RAM) that is used by the processing units to carry out program instructions, and firmware 18 whose primary purpose is to seek out and load an operating system from one of the peripherals (usually the permanent memory device) whenever the computer is first turned on. Processing units 12*a* and 12*b* communicate with the peripheral devices by various means, including a generalized interconnect or bus 20. Computer system 10 may have many additional components which are not shown, such as serial, parallel and universal bus ports for connection to, e.g., modems or printers. Those skilled in the art will further appreciate that there are other components that might be used in conjunction with those shown in the block diagram of FIG. 1; for example, a display adapter might be used to control a video display monitor, a memory controller can be used to access memory 16, etc. Also, instead of connecting I/O devices 14 directly to bus 20, they may be connected to a secondary (I/O) bus which is further connected to an I/O bridge to bus 20. The computer can have more than two processing units.

In a symmetric multi-processor (SMP) computer, all of the processing units are generally identical, that is, they all use a common set or subset of instructions and protocols to operate, and generally have the same architecture. A typical architecture is shown in FIG. 1. A processing unit includes a processor core 22 having a plurality of registers and execution units, which carry out program instructions in order to operate the computer. An exemplary processing unit includes the PowerPC™ processor marketed by International Business Machines Corp. The processing unit can also have one or more caches, such as an instruction cache 24 and a data cache 26, which are implemented using high speed memory devices. Caches are commonly used to temporarily store values that might be repeatedly accessed by a processor, in order to speed up processing by avoiding the longer step of loading the values from memory 16. These caches are referred to as "on-board" when they are integrally packaged with the processor core on a single integrated chip 28. Each cache is associated with a cache controller (not shown) that manages the transfer of data between the processor core and the cache memory.

A processing unit 12 can include additional caches, such as cache 30, which is referred to as a level 2 (L2) cache since it supports the on-board (level 1) caches 24 and 26. In other words, cache 30 acts as an intermediary between memory 16 and the on-board caches, and can store a much larger amount of information (instructions and data) than the on-board caches can, but at a longer access penalty. For example, cache 30 may be a chip having a storage capacity of 256 or 512 kilobytes, while the processor may be an IBM PowerPC™ 604-series processor having on-board caches with 64 kilobytes of total storage. Cache 30 is connected to bus 20, and all loading of information from memory 16 into processor core 22 usually comes through cache 30. Although FIG. 1 depicts only a two-level cache hierarchy, multi-level cache hierarchies can be provided where there are many levels of interconnected caches.

A cache has many "blocks" which individually store the various instructions and data values. The blocks in any cache are divided into groups of blocks called "sets" or "congruence classes." A set is the collection of cache blocks that a given memory block can reside in. For any given memory block, there is a unique set in the cache that the block can be mapped into, according to preset mapping functions. The number of blocks in a set is referred to as the associativity of the cache, e.g. 2-way set associative means that for any given memory block there are two blocks in the cache that the memory block can be mapped into; however, several different blocks in main memory can be mapped to any given set. A 1-way set associate cache is direct mapped, that is, there is only one cache block that can contain a particular memory block. A cache is said to be fully associative if a memory block can occupy any cache block, i.e., there is one congruence class, and the address tag is the full address of the memory block.

An exemplary cache line (block) includes an address tag field, a state bit field, an inclusivity bit field, and a value field for storing the actual instruction or data. The state bit field and inclusivity bit fields are used to maintain cache coherency in a multiprocessor computer system (to indicate the validity of the value stored in the cache). The address tag is a subset of the full address of the corresponding memory block. A compare match of an incoming address with one of the tags within the address tag field indicates a cache "hit." The collection of all of the address tags in a cache (and sometimes the state bit and inclusivity bit fields) is referred to as a directory, and the collection of all of the value fields is the cache entry array.

When all of the blocks in a congruence class for a given cache are full and that cache receives a request, whether a "read" or "write," to a memory location that maps into the full congruence class, the cache must "evict" one of the blocks currently in the class. The cache chooses a block by one of a number of means known to those skilled in the art (least recently used (LRU), random, pseudo-LRU, etc.) to be evicted. If the data in the chosen block is modified, that data is written to the next lowest level in the memory hierarchy which may be another cache (in the case of the L1 or on-board cache) or main memory (in the case of an L2 cache, as depicted in the two-level architecture of FIG. 1). By the principle of inclusion, the lower level of the hierarchy will already have a block available to hold the written modified data. However, if the data in the chosen block is not modified, the block is simply abandoned and not written to the next lowest level in the hierarchy. This process of removing a block from one level of the hierarchy is known as an "eviction." At the end of this process, the cache no longer holds a copy of the evicted block.

FIG. 2 illustrates the foregoing cache structure and eviction process. A cache 40 (L1 or a lower level) includes a cache directory 42, a cache entry array 44, an LRU array 46, and control logic 48 for selecting a block for eviction from a particular congruence class. The depicted cache 40 is 8-way set associative, and so each of the directory 42, cache entry array 44 and LRU array 46 has a specific set of eight blocks for a particular congruence class as indicated at 50. In other words, a specific member of the congruence crass in cache directory 42 is associated with a specific member of the congruence class in cache entry array 44 and with a specific member of the congruence class in LRU array 46, as indicated by the "X" shown in congruence class 50.

Each of the blocks in directory 42 are connected to the control logic via an error correction code (ECC) circuit 52. A bit in a given cache block may contain an incorrect value, either due to a soft error (such as stray radiation or electrostatic discharge) or to a hard error (a defective cell). ECCs can be used to reconstruct the proper data stream. Some ECCs can only be used to detect and correct single-bit errors, i.e., if two or more bits in a particular block are invalid, then the ECC might not be able to determine what the proper data stream should actually be, but at least the failure can be detected. Other ECCs are more sophisticated and even allow detection or correction of double errors. These latter errors are costly to correct, but the design tradeoff is to halt the machine when double-bit errors occur. Although only directory 42 is shown with ECC circuits, these circuits can similarly be used with other arrays, such as cache entry array 44.

The outputs of ECC circuits 52, whose values correspond to (corrected) memory block addresses, are connected to respective comparators 54 each of which also receives the address of the requested memory block. If a valid copy of a requested memory block is in the congruence class 50, then one, and only one, of the comparators 54 will output an active signal. The outputs of comparators 54 are connected to a multiplexer 56 and also to an OR gate 58, whose output controls multiplexer 56. If a cache hit occurs (a requested address matches with an address in cache directory 42), then OR gate 58 activates multiplexer 56 to pass on a signal indicating which member of the congruence class matches the address. This signal controls another multiplexer 60 which receives inputs from each of the entries in cache entry array 44. In this manner, when a cache hit in the directory occurs, the corresponding value is passed through multiplexer 60 to a bus 62.

If a cache miss occurs, and if all of the blocks in the particular congruence class 50 already have valid copies of memory blocks, then one of the cache blocks in congruence class 50 must be selected for victimization. This selection is performed using the LRU bits for the congruence class in LRU array 46. For each cache block in the class, there are a plurality of LRU bits, for example, three LRU bits per block for an 8-way set associative cache. The LRU bits from each block in the class are provided as inputs to a decoder 64 having an 8-bit output to indicate which of the blocks is to be victimized. This output is coupled to multiplexer 56. In this manner, if OR gate 58 is not active, multiplexer 56 passes on an indication of the cache block to be used based on the outputs of decoder 64.

The ECC circuits discussed above are one way to deal with soft errors arising in memory cells. Another approach used for dealing with hard errors is to provide redundancy within the arrays (directory, LRU, cache). When a cache chip is fabricated, it can be tested to determine if there are any defective row or column lines in each of the arrays (row and column lines are tested for the entire cache, directory, and LRU). If an array is defective, a fuse can be permanently blown to indicate its defective nature. A comparison is then made inside the array for each accessed address to see if it matches with a defective address. If so, appropriate logic re-routes the address to one of many extra row and column lines formed on the chip, i.e., from redundant bit lines (columns) and word lines (rows). The number of extra bit and word lines may vary depending upon the defect rate and desired chip yield. For a low-defect (larger physical size) cache, two extra lines might be provided for every 256 regular lines, while in a high-defect (smaller physical size) cache, two extra lines might be provided for every eight regular lines.

With advancements in chip fabrication and computer configurations, L2 and L3 caches are increasing in size, requiring larger on-chip directories and on-chip (or off-chip) data cache entry arrays. These larger, dense arrays decrease the reliability of the overall chip/system due to increased chances of defects that occur in manufacturing or in the field. In order to increase the reliability of these larger directory/data caches, many different means have been traditionally employed to address these problems, such as in-line parity or ECC detection/correction, but there are several disadvantages and limitations with the foregoing approaches. While soft errors (i.e., intermittent faults) are correctable using ECC circuits that repair and re-write the data in the directory, this technique does not solve hard faults where a cache directory bit is stuck either high or low. In-line ECC correction can be used to correct stuck faults, but this approach penalizes access time to the array, since correction is needed with each access, and repeatedly consumes part of the error correction capability. The use of redundant cache lines can partially overcome hard faults, but these redundant structures are wasteful as they take up valuable space on the chip or system board. Redundancy is also limited in its ability to correct a large number of defects. Moreover, hard errors that arise after testing may be not correctable using redundant lines. When these types of hard faults occur, conventional ECC circuits that try to repair and re-write the data will lead to a situation wherein the system repetitively attempts to correct the error without success. In this situation, the machine cannot recover and must be brought down and repaired, costing customers time and money, if full error correction and detection resources are to be maintained.

In light of the foregoing, it would be desirable to devise and improved method for detecting/correcting hard errors in memory devices such as caches. It would be further advantageous if the method could be implemented without requiring wasteful redundant circuitry or in-line correction which penalizes directory access time and consequently degrades system performance.

SUMMARY OF THE INVENTION

It is therefore one object of the present invention to provide an improved memory structure for a computer system, particularly a cache memory.

It is another object of the present invention to provide such an improved cache memory which utilizes error correction code (ECC).

It is yet another object of the present invention to provide an improved method and system for detecting and correcting errors in a computer system, whether in a cache memory or on a system bus, which can solve a hard error (stuck bit) condition without resorting to slow in-line correction.

The foregoing objects are achieved in a method of correcting an error in a data bit of a computer system, by applying data with a number of bits N to an error correction code (ECC) matrix to yield an error detection syndrome, wherein the ECC matrix has a plurality of rows and columns with a given column corresponding to a respective one of the data bits, and selected bits are set in the ECC matrix along each column and each row such that encoding for the ECC matrix allows N-bit error correction and (N−1)-bit error detection. The resulting error detection syndrome is resolved to detect the error in the data as read from a location of the data processing system. In the illustrative embodiment, the ECC matrix has an odd number of bits set in each row thereof. These properties facilitate the use of an inversion bit for correcting hard faults in the stored data. When an error is detected and after it is corrected, the corrected data is inverted and then rewritten to the storage or transmission media. The corresponding inversion bit for this entry is accordingly set to indicate that the data as currently stored is inverted. Thereafter, the data is re-read from the media, and if the error was due to a hard fault (stuck bit), it will appear correct (after applying the polarity indicated by the inversion bit), since the inversion will have changed the value of the defective bit to the stuck value. The inversion bit may be part of the data itself. In this case, one of the columns in the ECC matrix corresponds to the inversion bit, and each bit in that column of the matrix is set. This matrix may be applied to any location of a computer system which uses ECC, including a bus or communications link or a chip interface, and is particularly useful for memory devices such as cache memory. By including the inversion bit on a system bus with the data, the system bus can invert the polarity of the data to compensate for a known stuck bit on the bus. The particular configuration of the ECC matrix allows detection and correction even if the error arises in the inversion bit (creating an otherwise undetectable error), wherein all of the bits of the data are erroneous because of the effect of the erroneous inversion bit. The ECC matrix defined in this invention will allow for correction/detection on any of the data and ECC bits including errors on the inversion bit itself. This technique allows a system bus to maintain full ECC protection even in the presence of a stuck bit.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

As explained in the Background section, conventional error correction code (ECC) circuitry is inadequate for addressing hard errors (stuck bits) in computer devices such as a memory array (e.g., cache) or communications link (e.g., system bus). The present invention solves the problems of stuck bits through a new hardware mechanism that uses a special ECC matrix to recover from stuck fault directory array conditions. The ECC matrix is adapted to apply to a new bit that is included with the cache directory address/tag or system bus transmission, an additional "inversion" bit which indicates the relative polarity of the stored information. The following description implements the invention in a third level (L3) cache directory array, but those skilled in the art will appreciate that it is equally useful for other memory devices which store values (program instructions or operand data).

Figure 1:
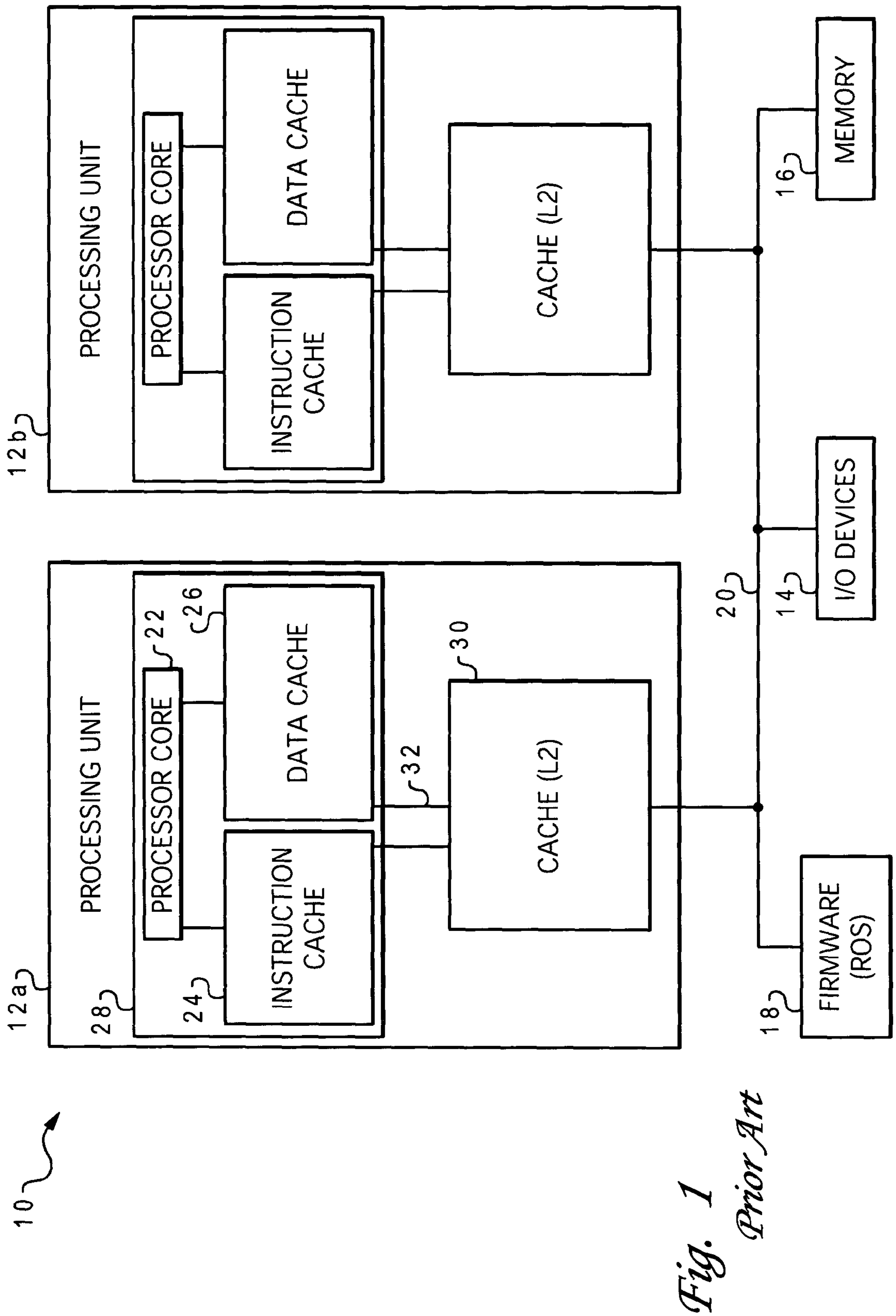
FIG. 1 is a block diagram of a conventional computer system, depicting a memory hierarchy which includes a main memory device and multiple memory caches.
Figure 2:
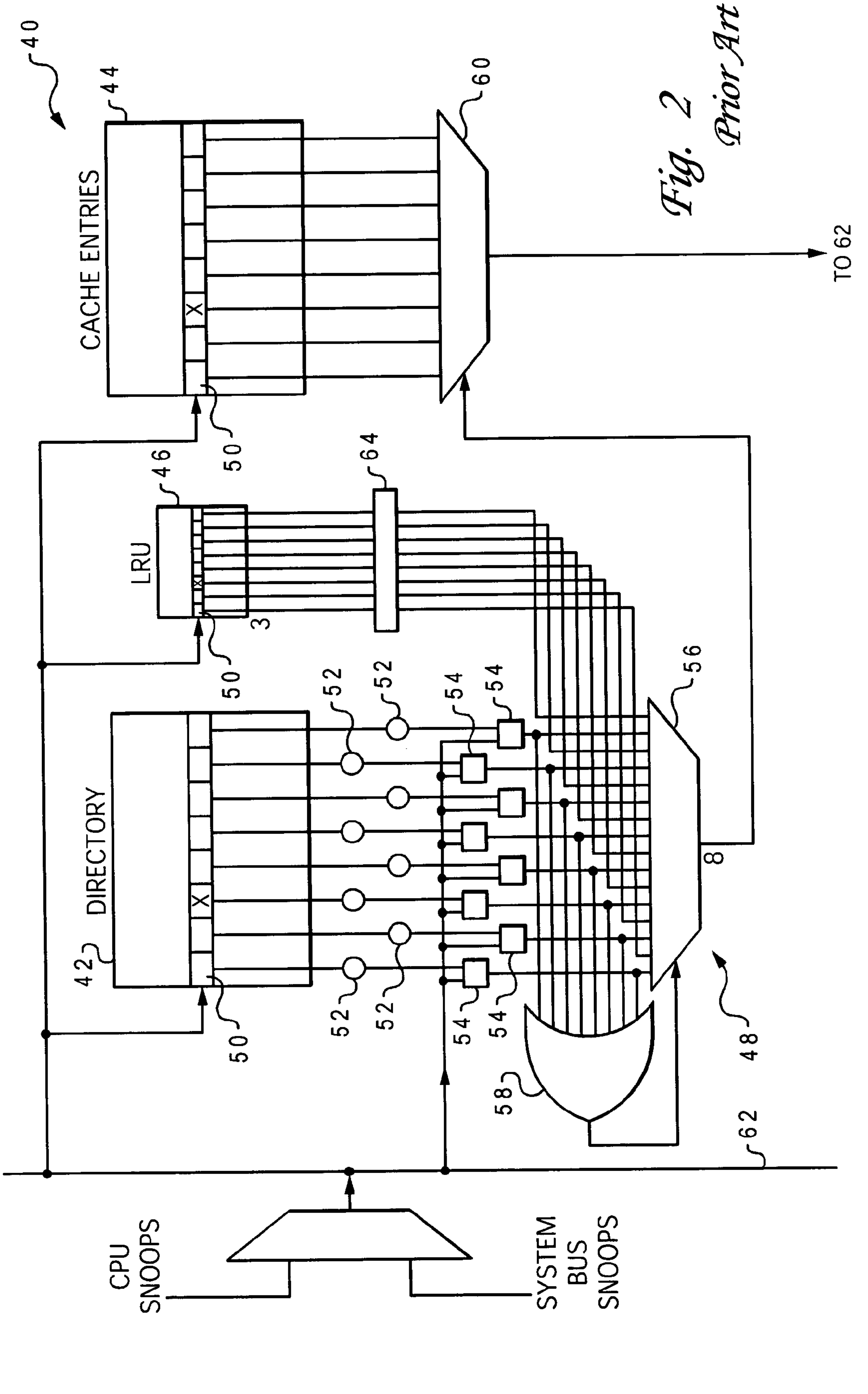
FIG. 2 is a high-level schematic diagram of a set-associative cache memory having in-line error correction code (ECC) circuitry.
Figure 3A:
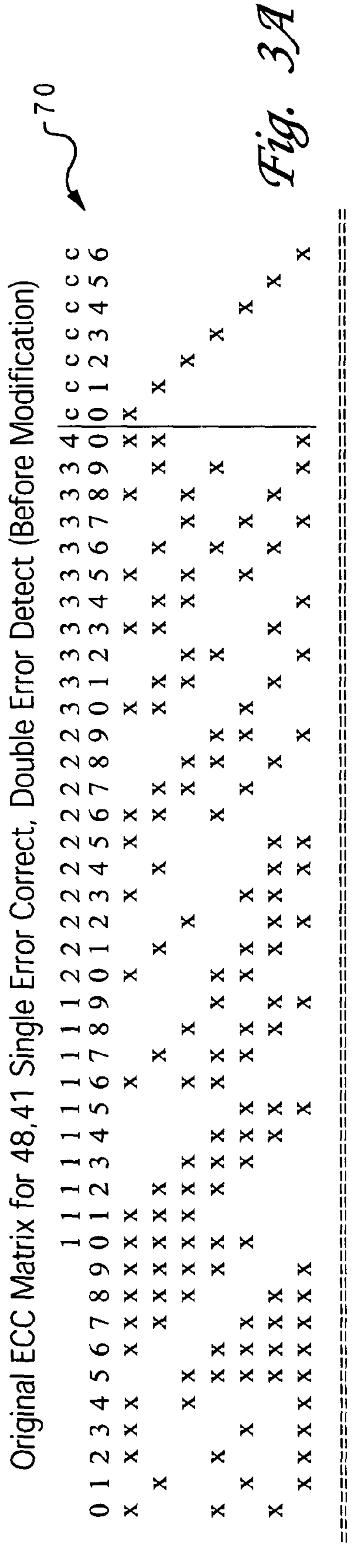
FIG. 3A is a depiction of an ECC matrix designed according to prior art techniques to check a 48-bit value.

FIG. 3A shows an ECC matrix 70 that is designed, according to prior art techniques, for a 48-bit value which includes 41 data bits and 7 ECC bits. This matrix may be used in a conventional manner to check an address tag for any error. If all of the 48 stored bits are correct, then application of the ECC matrix of FIG. 3A will result in a syndrome of all zeros, to indicate that no correction is necessary. The 48-bit value is applied separately to each of the seven rows of the matrix in an XOR fashion, to respectively yield the seven bits of the syndrome. If only one bit is erroneous, the resulting syndrome can be used to detect which bit is in error. In this original ECC matrix 70, as well as all traditional ECC matrices that cover single-bit correct/double-bit detect (SBC/DBC) errors, there are an odd number of bits set in each column that defines the signature for a correctable bit. While some of the rows have an odd number of bits set, other rows have an even number, such as rows 1 and 7 in matrix 70 which each have 20 bits set.

Figure 3B:
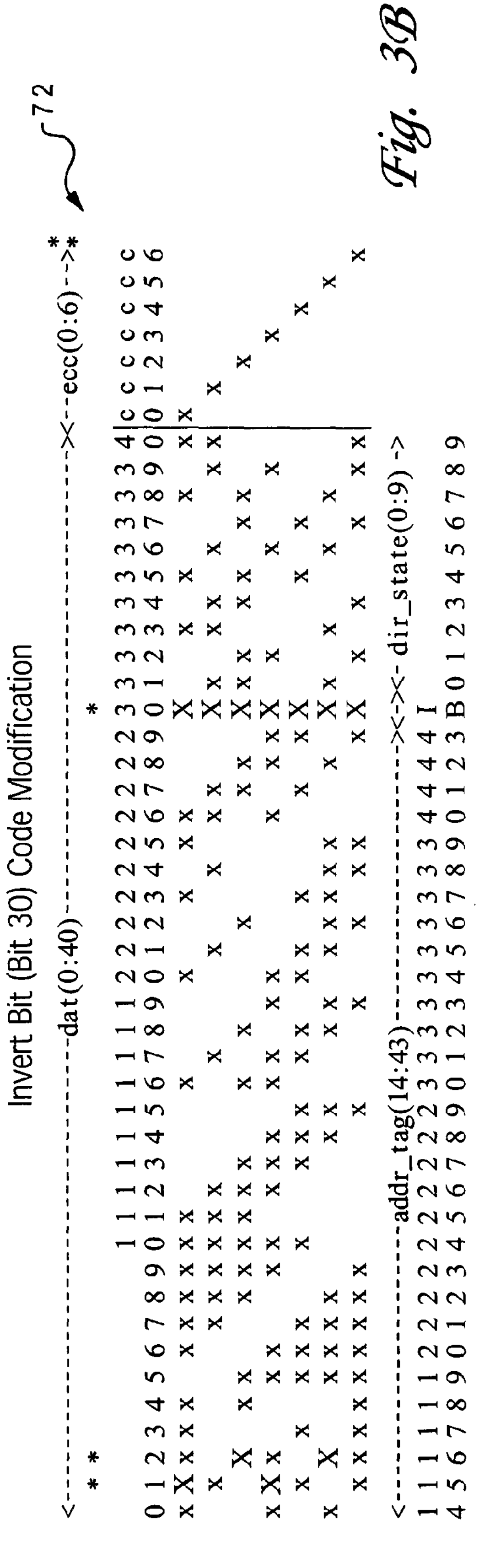
FIG. 3B is a depiction of a novel ECC matrix constructed in accordance with the present invention which is applied to a 48-bit value that includes an inversion bit.

FIG. 3B shows a representation of an electronic ECC matrix 72 for a 48-bit value which has been modified according to the present invention. In this specific implementation, the modifications are twofold. First, one column of matrix 72 corresponds to an inversion bit that indicates the relative polarity (active-low or active-high) of the stored data, and this column has different bits set compared to the prior art matrix 70. For this example, the inversion bit (IB) is bit number 30 (out of data bits 0:40), and it can be seen in FIG. 3B that all of the bits in the corresponding column of matrix 72 have been set. Secondly, bits have been added to other columns of matrix 72, with the result that each horizontal row in the matrix has an odd number of bits set. As compared with prior art matrix 70, the specific changes made to matrix 72 to yield this characteristic are additional settings for the columns that correspond to data bits 1:2 (in addition to setting of all bits for IB column 30). In particular, two additional bits have been set in the column corresponding to data bit 1, and two additional bits have been set in the column corresponding to data bit 2. The modified columns (relative to prior art matrix 70) have been marked with asterisks in FIG. 3B. Those skilled in the art will appreciate that other settings may be used in similar 48,41 matrices to achieve the same result of all rows having an odd number of bits set. The inversion bit does not have to be accounted for with the FCC matrix.

With this novel matrix construction and the associated syndrome encoding, FCC matrix 72 acquires the properties for an "N" bit data field covered by the ECC of:

single-bit error detect;

multi-bit error correct;

N-bit error correct; and (N−1)-bit error detect.

These last two properties are useful since the inversion bit which indicates the polarity of the data, is also stored and covered by the FCC encoding. If there is a single-bit error on the polarity bit, then the data that is presented to the FCC check logic will have all "N" bits incorrect, but the matrix is built to detect and correct for this case. If a double-bit error occurs and one of the bits in error is the polarity bit, the matrix will also detect this property and indicate this is a double-bit error that is uncorrectable.

In the illustrative embodiment, the matrix is applied to 48 bits that include 41 data bits dat(0:40) and 7 ECC bits ecc(0:6). The 41 data bits include a 30-bit L3 address tag addr_tag(14:43) corresponding to dat(0:29), the inversion bit corresponding to dat(30), and 10 bits for cache state information (coherency and inclusivity bits) dir state(0:9) corresponding to dat(31:40). Thus one polarity bit is provided for each entry in the cache directory. "Block code" type ECC encoding is used for this particular example.

The polarity bit stored in the L3 directory with the address tag and state information (and also covered by the ECC bits) indicates whether the information was stored into the L3 directory with either active-high or active-low polarity. When an ECC error is detected, the stored information can be written back into the L3 directory with the opposite (reverse) polarity. In this manner, a stuck bit fault will subsequently match the reverse polarity data and not cause an error on a subsequent read. The use of the inversion bit thus easily overcomes any single-bit error caused by a hard fault, without requiring redundant storage cells or in-line ECC detection/correction, and further carries out the inversion-correction procedure only as necessary, on-the-fly.

When a directory read is performed (i.e. at machine dispatch time), the raw/unchecked L3 directory data is sent in parallel thru a "tag compare" pipeline and to an ECC check pipeline. If an error is discovered, the directory machine dispatch sequence is aborted due to an ECC error, and a polarity error correction (PEC) sequence takes control of the directory so it can repair/re-write the directory with the corrected data. Meanwhile, the previously aborted dispatch, when re-attempted, will eventually be successful once the PEC sequence has repaired a single-bit "soft" correctable error (CE).

In order to mask a single stuck bit fault in the L3 directory (where the array cell is stuck at a 0 or 1), the PEC sequence now has the added ability to control the polarity of the data written to the directory array. The PEC sequence can invert the data written to the array by asserting the dw_invert_bit during a PEC sequence to mask a stuck bit (write the stuck value to the bit). The dw_invert_bit is stored in the directory to log whether the data is inverted in the directory and should thus be inverted when read out. Because the invert bit is stored in the directory, the matrix is enhanced to detect double bit errors and provide single bit correction on all bits including the invert bit as explained above. With the described modifications, ECC matrix 72 will correct single-bit faults on entry, including the dw_invert bit (due to a soft error or a stuck bit) and will provide double bit error detection involving any two bits in an entry including a double bit error that involves the dw_invert_bit.

Figure 4A:
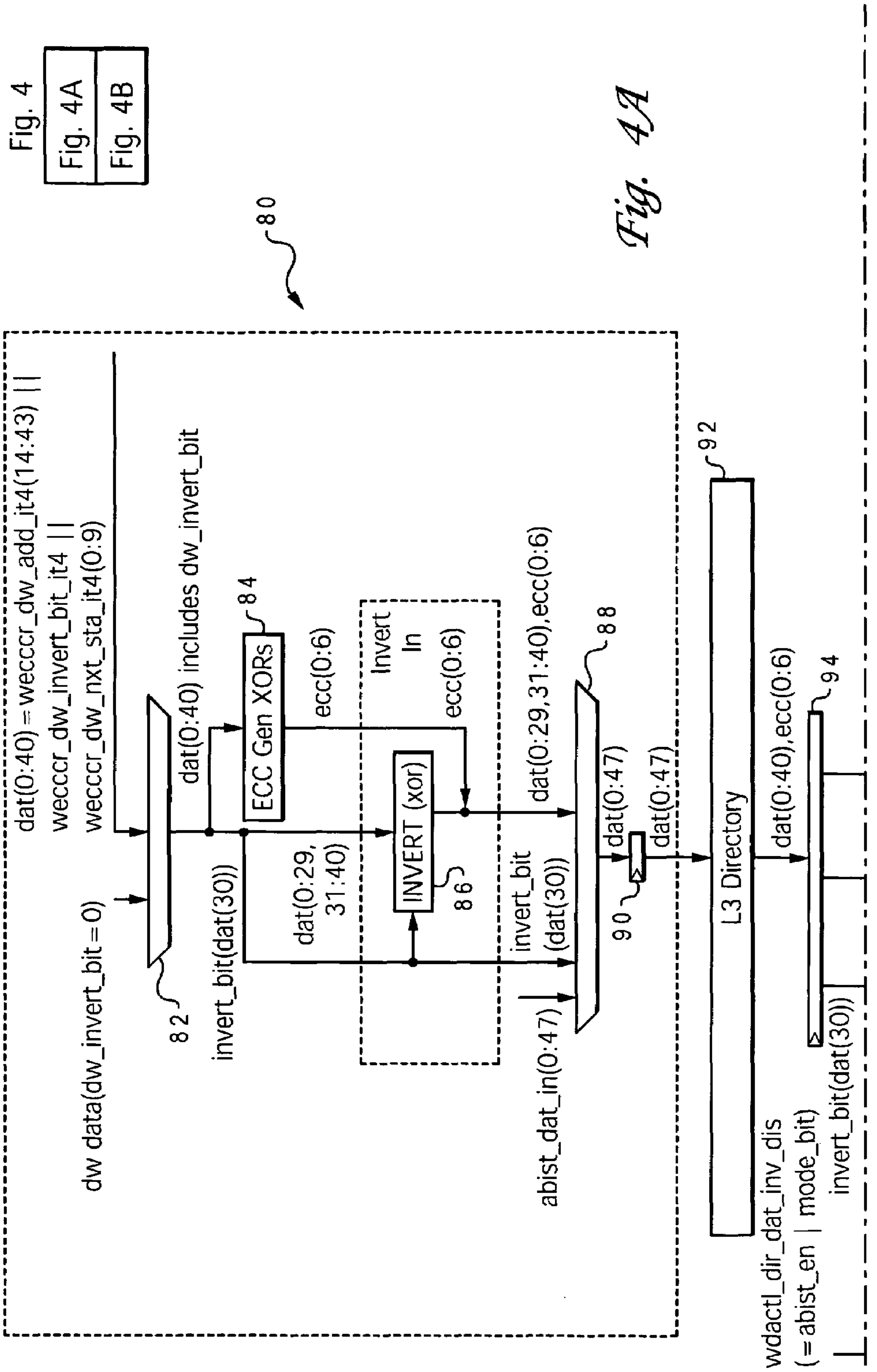
FIG. 4 is a high-level schematic diagram of one embodiment of ECC circuitry in a level 3 (L3) cache adapted to utilized an inversion bit to solve hard errors in the cache address directory.
Figure 4B:
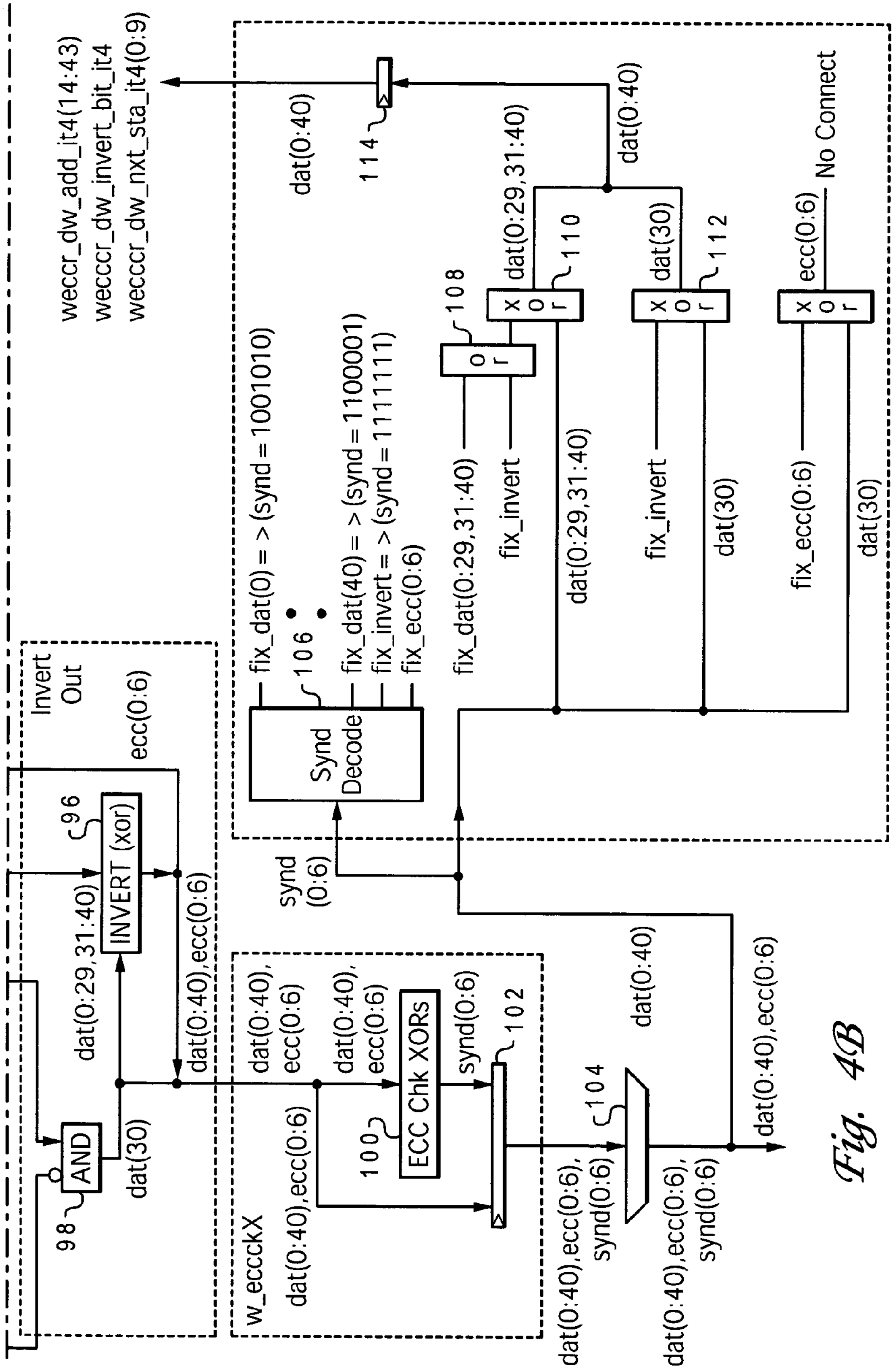

FIG. 4 illustrates the dataflow using the ECC matrix of FIG. 3B as applied to a directory for an 8-way set associative L3 cache. In the write circuitry 80 of the cache directory, the invert bit dw_invert_bit from the machine is first combined with the data by a multiplexer 82. The combined data is used by an ECC generator 84 to yield the ECC bits. Generation of the ECC bits uses the same syndrome encoding upon which ECC matrix 72 is based. The data also passes through an inverter 86 which is controlled by the invert bit, now dat(30). Normal direct writes by the machine (i.e., from a lower level cache or main memory) write the dw_invert_bit to 0. All of the data, including the invert bit and the ECC bits, are then combined with another multiplexer 88 and sent to a latch 90 for eventual writing to the L3 directory array 92.

While the invert bit controls the polarity at which dat(0:29) and dat(31:40) are written by inverter 86, the polarities of dat(30) and ecc(0:6) are unaffected by the inverter. The polarity of ecc(0:6) is effectively inverted via ECC matrix 72 by setting all of the bits in the column that corresponds to the invert bit (column 30). When dw_invert bit is equal to zero, dat(0:29) and dat(31:40) will be written to the L3 directory as active high. When dw_invert_bit is equal to one, dat(0:29) and dat(31:40) will be written to the L3 directory as active low.

When the data is read from L3 directory array 92, it is first written to another latch 94, and then passed through another inverter 96 which is controlled by dat(30). Inversion may be disabled by setting a mode bit which is combined with dat(30) using an AND gate 98. The data, whose polarity has now been appropriately set, is forward to an ECC checker 100 which produces the syndrome, synd(0:6). ECC checker 100 uses ECC matrix 72, which can be hard-wired into the XOR circuitry. The data and syndrome are written to a latch 102 and multiplexer 104. The syndrome is resolved by a decoder 106. A syndrome of "0000000" signifies the data is correct (or at least no errors were detected). A syndrome of "1111111" signifies the data has a CE on the invert bit. Decoder 106 has a series of outputs fix_dat(n) which are individually active when the syndrome indicates a single-bit error for the particular data bit n (dat(0:29,31:40)). Another output fix_invert is active when the syndrome is "1111111". The fix_dat(n) bits are first combined with the fix_invert bit at an OR gate 108, and then act on the data bits using an XOR gate 110. The fix_invert bit is also applied to the invert bit dat(30) at XOR gate 112. All of the data bits dat(0:40) are then passed to the output latch 114.

All double-bit errors will result in a synd(0:6) that doesn't match a legal CE syndrome. Because the signature of the synd(0:6) values for CE cases have an odd number of bits set in their signature (including a CE on the dw_invert_bit which has all 7 bits set), a double-bit error will result in the synd(0:6) having an even number of bits set (including the case where the dw_invert_bit itself is involved). ECC matrix 72 has the property that, when you combine two CE syndromes, the resulting syndrome will have an even number of synd(0:6) bits set which indicates a double bit error.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, the above-description applies the ECC matrix and inversion bit to an address tag for a cache entry (i.e., to the cache directory), but it could also be applied to the cache entry array which holds the values (program instructions or operand data) to which an address tag points. The above-described matrix can also be applied to any element in the system that carries ECC protection, including a system bus. By adding an inversion bit to a system bus and using the inversion technique described above, the system bus can maintain full ECC protection even in the presence of a stuck bit, by inverting the data to always match the stuck bit logic level. It is therefore contemplated that such modifications can be made without departing from the spirit or scope of the present invention as defined in the appended claims.

What is claimed is:

1. A method of checking for errors in an ECC protected mechanism of a data processing system, comprising the steps of:

applying data with a number of bits N to an error correction code (ECC) matrix to yield an error detection syndrome, the ECC matrix having a plurality of rows and columns wherein a given column corresponds to a respective one of the data bits; and resolving the error detection syndrome to detect at least one error in data as read from a location of the data processing system;

using the error detecting syndrome to yield corrected data;

inverting the corrected data as it is written back to the location of the data processing system; and setting an inversion bit to indicate that the data as currently stored is inverted, wherein the inversion bit is part of the data, one of the columns in the ECC matrix corresponds to the inversion bit, and each bit in the column of the ECC matrix which corresponds to the inversion bit is set.

2. The method of claim 1, further comprising the step of selectively setting the bits in the ECC matrix such that an odd number of bits are set in each row thereof.

3. The method of claim 1 wherein the encoding for the ECC matrix further allows single-bit error detection, and said resolving step detects one and only one error in the data.

4. The method of claim 1 wherein said resolving step detects multiple uncorrectable errors.

5. The method of claim 1 wherein said resolving step detects a correctable error on the inversion bit.

6. An error correction code checker comprising:

an electronic error correction code (ECC) matrix adapted to check data having a number of bits N and yield an error detection syndrome for the data, said ECC matrix having a plurality of rows and columns wherein a given column corresponds to a respective one of the data bits, one of said columns of said ECC matrix corresponds to an inversion bit which indicates a polarity of the data, and each bit in said column corresponding to the inversion bit is set.

7. The error correction code checker of claim 6 wherein said bits in said ECC matrix are set such that an odd number of bits are set in each row thereof.

8. The error correction code checker of claim 6 wherein the encoding for said ECC matrix further allows single-bit error detection.

9. The error correction code checker of claim 6 further comprising a syndrome decoder which resolves the error detection syndrome to determine whether the data contains any errors.

10. The error correction code checker of claim 9 wherein the syndrome decoder further corrects any single error found in the data.

11. A computer system comprising:

means for processing program instructions; and a memory device connected to said processing means, said memory device including an error correction code checker having an error correction code (ECC) matrix adapted to check data having a number of bits N, to yield an error detection syndrome for the data, said ECC matrix having a plurality of rows and columns wherein a given column corresponds to a respective one of the data bits, one of said columns of said ECC matrix corresponds to an inversion bit which indicates a polarity of the data, and each bit in said column corresponding to the inversion bit is set.

12. The computer system of claim 11 wherein said bits in said ECC matrix are set such that an odd number of bits are set in each row thereof.

13. The computer system of claim 11 wherein the encoding for said ECC matrix further allows single-bit error detection.

14. The computer system of claim 11 wherein said memory device further includes a syndrome decoder which resolves the error detection syndrome to determine whether the data contains any errors.

15. The computer system of claim 14 wherein the syndrome decoder further corrects any single error found in the data.

* * * * *

UNITED STATES PATENT AND TRADEMARK OFFICE

CERTIFICATE OF CORRECTION

PATENT NO. : 7,069,494 B2
APPLICATION NO. : 10/418549
DATED : June 27, 2006
INVENTOR(S) : Cargnoni et al.

It is certified that error appears in the above-identified patent and that said Letters Patent is hereby corrected as shown below:

col. 3 line 12 change “crass” to --class--
col. 7 line 14 change “FCC” to --ECC--
col. 7 line 15 change “FCC” to --ECC--
col. 7 line 26 change “dir state(09) to --dir_state(0:9)--
col. 7 line 67 change “dw_invert bit” to --dw_invert_bit--
col. 8 line 24 change “dw_invert bit” to --dw_invert_bit--

Signed and Sealed this

Twenty-eighth Day of November, 2006

JON W. DUDAS
*Director of the United States Patent and Trademark Office*